(12) United States Patent
Duqi et al.

(10) Patent No.: US 11,054,327 B2
(45) Date of Patent: Jul. 6, 2021

(54) MICROELECTROMECHANICAL PIEZORESISTIVE PRESSURE SENSOR WITH SELF-TEST CAPABILITY AND CORRESPONDING MANUFACTURING PROCESS

(71) Applicant: STMicroelectronics S.r.l., Agrate Brianza (IT)

(72) Inventors: Enri Duqi, Milan (IT); Lorenzo Baldo, Bareggio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 214 days.

(21) Appl. No.: 16/248,415

(22) Filed: Jan. 15, 2019

(65) Prior Publication Data

US 2019/0219468 A1 Jul. 18, 2019

(30) Foreign Application Priority Data

Jan. 16, 2018 (IT) .................. 102018000001092

(51) Int. Cl.
*G01L 9/00* (2006.01)
*G01L 27/00* (2006.01)
(Continued)

(52) U.S. Cl.
CPC .......... *G01L 9/0052* (2013.01); *G01L 9/0054* (2013.01); *G01L 27/00* (2013.01);
(Continued)

(58) Field of Classification Search
CPC ..... G01L 19/147; G01L 9/0042; G01L 19/04; G01L 9/0054; G01L 9/0072;
(Continued)

(56) References Cited

U.S. PATENT DOCUMENTS 4,381,678 A  5/1983 Lombard et al.
4,825,685 A  5/1989 Breimesser
(Continued)

FOREIGN PATENT DOCUMENTS

CN  85108071 A  4/1986
CN  1233324 A  10/1999
(Continued)

OTHER PUBLICATIONS

Bruyker, D. et al., "A combined piezoresistive capacitive pressure sensor with self-test function based on thermal actuation," *Sensors and Actuators A*66: 70-75, 1998.
(Continued)

*Primary Examiner* — Andre J Allen
(74) *Attorney, Agent, or Firm* — Seed IP Law Group LLP (57) ABSTRACT

A microelectromechanical pressure sensor includes a monolithic body of semiconductor material having a front surface. A sensing structure is integrated in the monolithic body and has a buried cavity completely contained within the monolithic body at the front surface. A sensing membrane is suspended above the buried cavity and is formed by a surface portion of the monolithic body. Sensing elements of a piezoresistive type are arranged in the sensing membrane to detect a deformation of the sensing membrane as a result of a pressure. The pressure sensor is further provided with a self-test structure integrated within the monolithic body to cause application of a testing deformation of the sensing membrane in order to verify proper operation of the sensing structure.

21 Claims, 5 Drawing Sheets (51) Int. Cl.
*H01L 41/113* (2006.01)
*H01L 41/187* (2006.01)

(52) U.S. Cl.
CPC .......... *G01L 27/002* (2013.01); *G01L 27/007* (2013.01); *H01L 41/1138* (2013.01); *H01L 41/1876* (2013.01)

(58) Field of Classification Search
CPC ... G01L 13/025; G01L 19/14; G01L 19/0038; G01L 19/0084; G01L 9/0055; G01L 9/0075; G01L 19/0069; G01L 9/0052; G01L 9/0073; G01L 19/0092; G01L 19/0618; G01L 19/0645; G01L 19/143; G01L 9/0051; G01L 19/0007; G01L 19/0046; G01L 19/06; G01L 19/0627; G01L 19/0681; G01L 27/002; G01L 9/00; G01L 9/0041; G01L 9/0044; G01L 11/025; G01L 11/04; G01L 19/0023; G01L 19/0672; G01L 19/069; G01L 19/142; G01L 19/145; G01L 19/16; G01L 7/00; G01L 9/0047; G01L 9/06; G01L 9/065; G01L 9/12; G01L 11/02; G01L 13/00; G01L 15/00; G01L 19/0015; G01L 19/003; G01L 19/02; G01L 19/0609; G01L 19/083; G01L 19/10; G01L 19/148; G01L 27/005; G01L 7/08; G01L 7/082; G01L 7/163; G01L 7/166; G01L 9/0045; G01L 9/0048; G01L 9/006; G01L 9/007; G01L 9/0076; G01L 9/04; G01L 9/045; G01L 9/125; G01L 11/00; G01L 17/00; G01L 19/00; G01L 19/0076; G01L 19/08; G01L 19/141; G01L 19/146; G01L 1/142; G01L 1/2262; G01L 1/246; G01L 21/12; G01L 23/16; G01L 27/007; G01L 7/04; G01L 7/063; G01L 7/084; G01L 7/086; G01L 7/16; G01L 9/0002; G01L 9/0007; G01L 9/0016; G01L 9/0019; G01L 9/0022; G01L 9/0027; G01L 9/0033; G01L 9/0039; G01L 9/005; G01L 9/0058; G01L 9/0077; G01L 9/0079; G01L 9/008; G01L 9/0092; G01L 9/0095; G01L 9/025; G01L 9/08; G01L 9/085; G01L 9/105; G01L 9/14; G01L 9/16; H01L 2224/48091; H01L 2924/00014; H01L 2224/48137; H01L 2224/48145; H01L 2224/73265; H01L 2924/00012; H01L 2224/04105; H01L 2224/24137; H01L 2224/49175; H01L 24/19; H01L 2924/1461; H01L 2924/1815; H01L 2924/18162; H01L 29/84; H01L 41/047; H01L 41/0475; H01L 41/1132
USPC ................................................ 73/700–756
See application file for complete search history.

(56) References Cited

U.S. PATENT DOCUMENTS

| | | | | |
|---|---|---|---|---|
| 8,008,738 | B2* | 8/2011 | Villa | .................... G01L 13/025 |
| | | | | 257/415 |
| 9,260,296 | B2 | 2/2016 | Chu et al. | |
| 10,048,148 | B2* | 8/2018 | Baldo | .................. B81B 3/0021 |
| 2002/0092355 | A1 | 7/2002 | Davey | |
| 2010/0050776 | A1 | 3/2010 | Fuhrmann et al. | |
| 2013/0193529 | A1 | 8/2013 | Burchard | |
| 2013/0305804 | A1 | 11/2013 | Burchard et al. | |
| 2015/0260597 | A1 | 9/2015 | Pagani | |
| 2017/0284882 | A1* | 10/2017 | Baldo | ................. B81C 1/00182 |

FOREIGN PATENT DOCUMENTS

| | | |
|---|---|---|
| CN | 1334451 A | 2/2002 |
| CN | 1392399 A | 1/2003 |
| CN | 101520385 A | 9/2009 |
| CN | 101611299 A | 12/2009 |
| CN | 102157679 A | 8/2011 |
| CN | 103712737 A | 4/2014 |
| CN | 105283745 A | 1/2016 |
| CN | 205262665 U | 5/2016 |
| DE | 37 05 901 A1 | 9/1988 |
| EP | 1 324 382 B1 | 3/2007 |
| WO | WO 2008022901 A2 | 2/2008 |
| WO | 2012/101257 A1 | 8/2012 |

OTHER PUBLICATIONS

Ye, L., "Foreign Scientists' Research Trends on 'Wireless Pressure Sensors'," *China Academic Journal Electronic Publishing House*, 3 pages (w/ machine translation).

* cited by examiner

MICROELECTROMECHANICAL PIEZORESISTIVE PRESSURE SENSOR WITH SELF-TEST CAPABILITY AND CORRESPONDING MANUFACTURING PROCESS

BACKGROUND

Technical Field

The present disclosure relates to a MEMS (Micro-Electromechanical Systems) pressure sensor with self-test capability and to a corresponding manufacturing process.

Description of the Related Art

Semiconductor integrated pressure sensors are known, made with micromanufacturing techniques typical of MEMS.

Such sensors are, for example, used in portable or wearable electronic apparatuses, or in the automotive field, for barometric and hydraulic applications; for example, pressure sensors with high full scale (up to 350 bar) are used for braking-system applications, associated with the brake pedal of the vehicle.

In particular, piezoresistive pressure sensors are known, which base their operation on piezoresistivity, i.e., on the capacity of some materials to modify their resistivity as the mechanical stresses to which they are subjected vary. For instance, the resistivity decreases when compressive stresses are applied, whereas it increases when tensile stresses are applied.

Piezoresistive pressure sensors generally include a membrane (or diaphragm), which is suspended above a cavity provided in a body of semiconductor material and undergoes deformation in the presence of incident pressure waves coming from the external environment.

Piezoresistive elements (generally constituted by implanted or diffused doped regions) are provided in the surface region of the membrane and are electrically connected together, for example, via a Wheatstone bridge. Deformation of the membrane causes an unbalancing of the Wheatstone bridge that may be detected by a purposely provided electronic circuit (coupled to the micromechanical structure of the sensor), the so-called ASIC (Application-Specific Integrated Circuit), which derives from this unbalancing the value of the pressure acting on the membrane.

Even though these piezoresistive pressure sensors are widely and successfully used, they have some disadvantages, at least for certain applications.

In particular, these piezoresistive-pressure sensors do not enable easy implementation of self-test procedures, for testing proper operation thereof at the end of the manufacturing process or during operation.

In this regard, it is known that in some fields of application, in particular in the automotive field, self-test capability of the electronic systems is expressly required in order to avoid errors and prevent failures.

Pressure sensors of a capacitive type generally enable these self-test procedures, by application of appropriate testing stimuli to the corresponding capacitor plates and reading of the resulting capacitive variation. However, these sensors suffer from certain disadvantages, amongst which include a greater non-linearity of response, a dependence on the possible formation of humidity between the capacitor plates, and the impossibility of reaching high full-scale values, which may advise against their use, at least in given fields of application.

BRIEF SUMMARY

An aim of the present disclosure is to provide a solution that will enable at least some of the drawbacks of the known art to be overcome.

In one embodiment, a microelectromechanical pressure sensor includes a monolithic body of semiconductor material having a front surface. A sensing structure is integrated in the monolithic body and includes a first buried cavity completely contained within the monolithic body at the front surface. A sensing membrane is suspended above the buried cavity in a surface portion of the monolithic body and sensing elements of a piezoresistive type are arranged in the sensing membrane and configured to detect a deformation of the sensing membrane in response to a pressure. A self-test structure is integrated within the monolithic body and configured to cause a testing deformation of the sensing membrane. This testing deformation enables verification of the proper operation of the sensing structure. Embodiments of methods of manufacturing such pressure sensors are also set forth in the present disclosure as well as electronic devices including such pressure sensors.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

As will be clarified in detail hereinafter, one aspect of the present solution envisages providing, in a microelectromechanical piezoresistive pressure sensor, a self-test structure, designed to operatively cooperate with a sensing structure of the same pressure sensor, in order to implement a procedure of self-testing of the operation of the same sensing structure.

Figure 1:
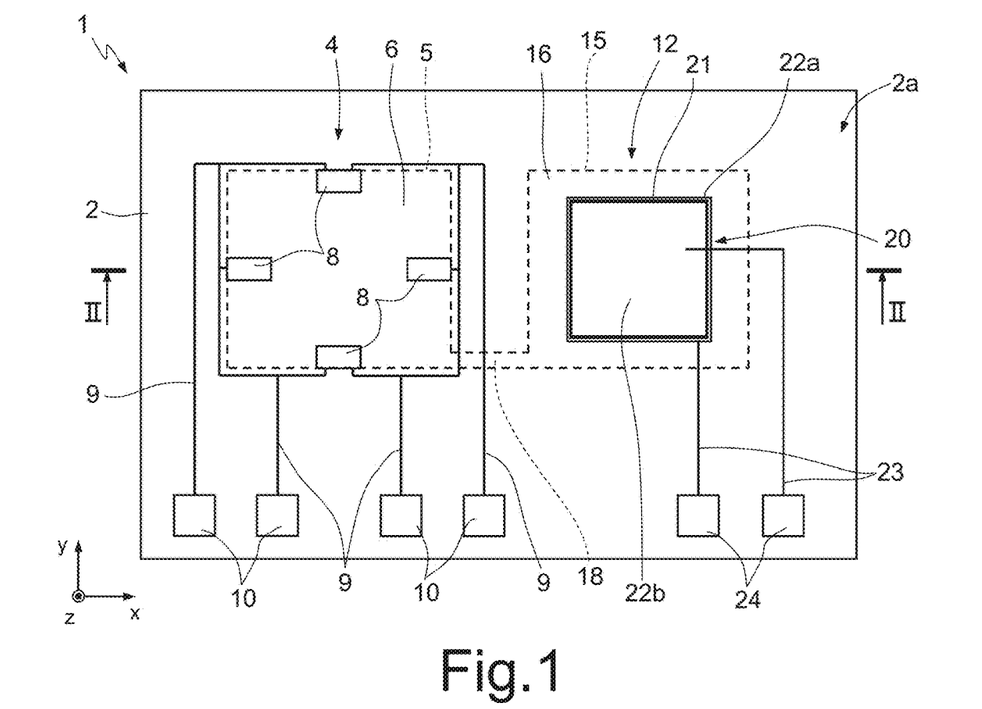
FIG. 1 is a schematic top plan view of a microelectromechanical piezoresistive pressure sensor according to one embodiment of the present solution.
Figure 2:
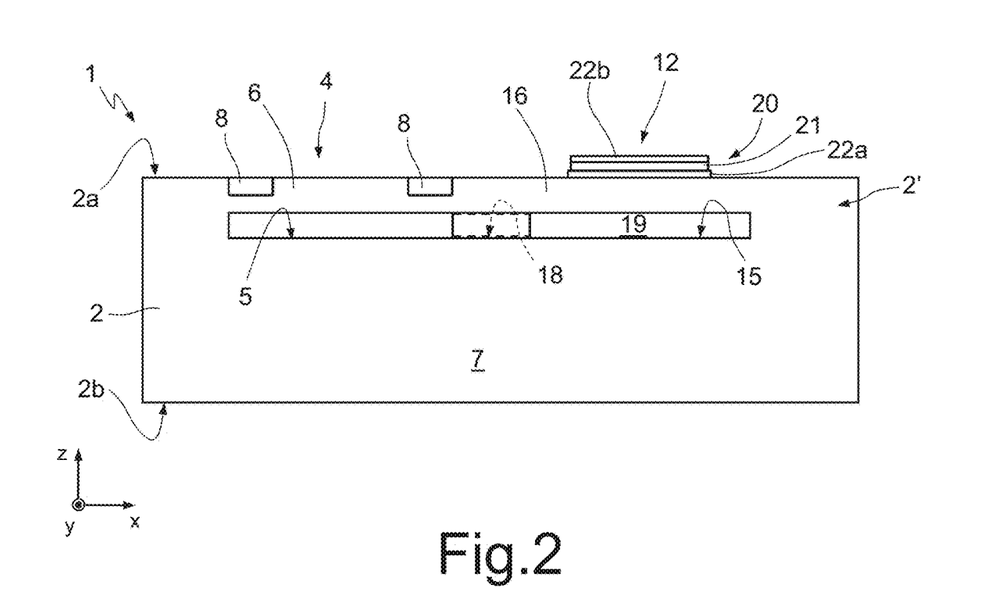
FIG. 2 is a schematic cross-sectional view of the pressure sensor of FIG. 1 taken along the line of section II-II of FIG. 1.

With reference first to FIGS. 1 and 2, a microelectromechanical piezoresistive pressure sensor designated as a whole by 1, according to an embodiment of the present solution, is now described.

The pressure sensor 1 includes a monolithic body 2 constituted by a compact and uniform region of semiconductor material, in particular silicon, having a front surface 2a and a rear surface 2b, both with a planar extension in a horizontal plane xy defined by a first horizontal axis x and a second horizontal axis y, and separated by a thickness along a vertical axis z, which defines with the first and second horizontal axes x, y a set of three Cartesian axes.

The pressure sensor 1 includes a sensing structure 4 integrated in the monolithic body 2 and including a buried cavity 5, completely contained within the monolithic body 2, at the front surface 2a, and a sensing membrane 6, suspended above the same buried cavity 5.

In particular, the buried cavity 5 is separated from the front surface 2a of the monolithic body 2 by the sensing membrane 6, which is formed by a surface portion 2' of the same monolithic body 2, and from the rear surface 2b of the same monolithic body 2 by a bulk region 7, which is compact, homogeneous, and uniform, of the same monolithic body 2.

The buried cavity 5 and the sensing membrane 6 have a generically polygonal shape in the horizontal plane xy; in the example illustrated (see, in particular, FIG. 2), this shape is substantially square.

The sensing structure 4 of the pressure sensor 1 further includes sensing elements 8, of a piezoresistive type, formed within the sensing membrane 6, in the proximity of the front surface 2a of the monolithic body 2. The sensing elements 8 are constituted by doped, implanted, or diffused surface regions, provided within the sensing membrane 6.

In the example illustrated, four sensing elements 8 are present, each arranged at a respective side of the sensing membrane 6, and positioned centrally with respect to the same side.

Electrical-connection elements 9, constituted by conductive lines, for example metal conductive lines, arranged on the front surface 2a of the monolithic body 2, electrically connect, in an appropriate manner, the sensing elements 8 together, and further connect the sensing elements 8 to electrical contact pads 10, which are also arranged on the front surface 2a of the monolithic body 2 so as to be accessible from outside, for connection, for example by electric wires or other electrical-connection elements, to a processing circuit, for example, of an ASIC type.

In one embodiment, the electrical-connection elements 9 connect together the sensing elements 8 so as to form a Wheatstone-bridge electrical circuit, and the electrical contact pads 10 consequently define, in pairs, input terminals (designed to receive from outside an electrical power-supply signal) and output terminals (designed to output an electrical output signal) of the Wheatstone-bridge electrical circuit.

Preferably, the electrical-connection elements 9 are arranged externally with respect to the sensing membrane 6 so as not to hinder deformation thereof during pressure sensing.

During operation, in a per se known manner, incident pressure waves from the external environment (i.e., from outside the monolithic body 2) cause deformation of the sensing membrane 6, and, consequently, deformation of the sensing elements 8. By the piezoresistive effect, the resistance of the sensing elements 8 varies with respect to a value at rest, causing an unbalancing of the Wheatstone bridge, which is appropriately electrically supplied, and generation of an electrical output signal that may be detected from outside, representing the value of pressure acting on the sensing membrane 6. According to a particular aspect of the present solution, the pressure sensor 1 further includes a self-test structure 12, integrated within the same monolithic body 2, in which also the sensing structure 4 is integrated.

The self-test structure 12 includes a respective buried cavity 15, completely contained within the monolithic body 2, at the front surface 2a, and an actuation membrane 16, suspended above the same buried cavity 15.

In particular, the buried cavity 15 is separated from the front surface 2a of the monolithic body 2 by the actuation membrane 16, which is formed by the surface portion 2' of the monolithic body 2, and from the rear surface 2b of the monolithic body 2 by the bulk region 7 of the same monolithic body 2.

The buried cavity 15 and the actuation membrane 16 also have a generically polygonal shape in the horizontal plane xy; in the example illustrated (see, in particular, FIG. 2), this shape is substantially square.

In particular, the buried cavity 15 of the self-test structure 12 is arranged in the monolithic body 2 alongside the buried cavity 5 of the sensing structure 4, at a same depth with respect to the front surface 2a of the same monolithic body 2.

Moreover, the self-test structure 12 includes a buried connection channel 18, contained within the monolithic body 2, which fluidically connects the buried cavities 5, 15 of the sensing structure 4 and of the self-test structure 12. In the example illustrated, the aforesaid connection channel 18 extends along the first horizontal axis x, parallel to the front surface 2a of the monolithic body 2, and connects the buried cavities 5, 15 at a corresponding corner portion thereof.

The connection channel 18 is provided at the same depth from the front surface 2a of the monolithic body 2 as that of the buried cavity 15 of the self-test structure 12 and of the buried cavity 5 of the sensing structure 4.

The aforesaid buried cavities 5, 15 and the connection channel 18 thus form, as a whole, a buried space 19, entirely contained and isolated within the monolithic body 2, not accessible from outside the same monolithic body 2.

According to an aspect of the present solution, this buried space 19 contains a controlled-pressure atmosphere, for instance, comprised between 0.1 and 100 mbar, for example, equal to 20 mbar; the buried space 19 contains residual gas (deriving from the manufacturing process, as described in detail hereinafter), for example, containing hydrogen and silane.

The self-test structure 12 further includes an actuation assembly 20, coupled to the actuation membrane 16, which includes a piezoelectric region 21 that may be operated for causing deformation of the actuation membrane 16 by the piezoelectric effect; the piezoelectric region 21 is constituted by an appropriate piezoelectrical material, such as PZT (lead titanate zirconate).

The aforesaid actuation assembly 20 further includes: a lower electrode 22a, arranged on the actuation membrane 16, on the front surface 2a of the monolithic body 2 (from which it is possibly separated by a separation layer, of dielectric material, not illustrated herein); and a upper electrode 22b, arranged on the piezoelectric region 21, which is in turn arranged on the lower electrode 22a. Basically, the piezoelectric region 21 is arranged between the lower and upper electrodes 22a, 22b, on the actuation membrane 16.

In the example illustrated, the lower electrode 22a has a conformation and an extension substantially corresponding to (slightly greater, for example, by one or a few microns) that of the piezoelectric region 21, which is arranged centrally with respect to the actuation membrane 16 and also has a generically polygonal conformation, for example, substantially square, with a size smaller than that of the actuation membrane 16 (as discussed in greater detail hereinafter); the upper electrode 22b also has a generically polygonal conformation, for example, substantially square, with a respective extension corresponding to that of the underlying piezoelectric region 21.

Electrical-connection elements 23, constituted by conductive paths or lines, for example, metal lines, electrically connect, in an appropriate manner, the lower and upper electrodes 22a, 22b to respective electrical contact pads 24, arranged on the front surface 2a of the monolithic body 2, so as to be accessible from outside, for connection, for example by electric wires or other electrical-connection elements, to the ASIC processing circuit.

During operation, application of an actuation stimulus via an appropriate electric potential $\Delta V$ between the lower and upper electrodes 22a, 22b of the actuation assembly 20 of the self-test structure 12 causes deformation, by the piezoelectric effect, of the actuation membrane 16, in particular deflection thereof along the vertical axis z; this deformation constitutes a testing deformation, for self-testing of the sensing structure 4.

The above testing deformation is in fact transmitted to the sensing membrane 6 of the sensing structure 4 by the residual gas, at a controlled pressure, present within the buried space 19, from the buried cavity 15 of the self-test structure 12 to the buried cavity 5 of the sensing structure 4, through the connection channel 18.

Consequently, the sensing membrane 6 undergoes deformation, causing a corresponding deformation of the sensing elements 8 and generation of an electrical output signal, which represents the actuation stimulus. Processing of this electrical output signal, as a function of the known characteristics of the actuation stimulus, enables verification of proper operation of the sensing structure 4.

The present Applicant has verified operation of the self-test structure 12 by tests and experimental simulations.

Figure 3A:
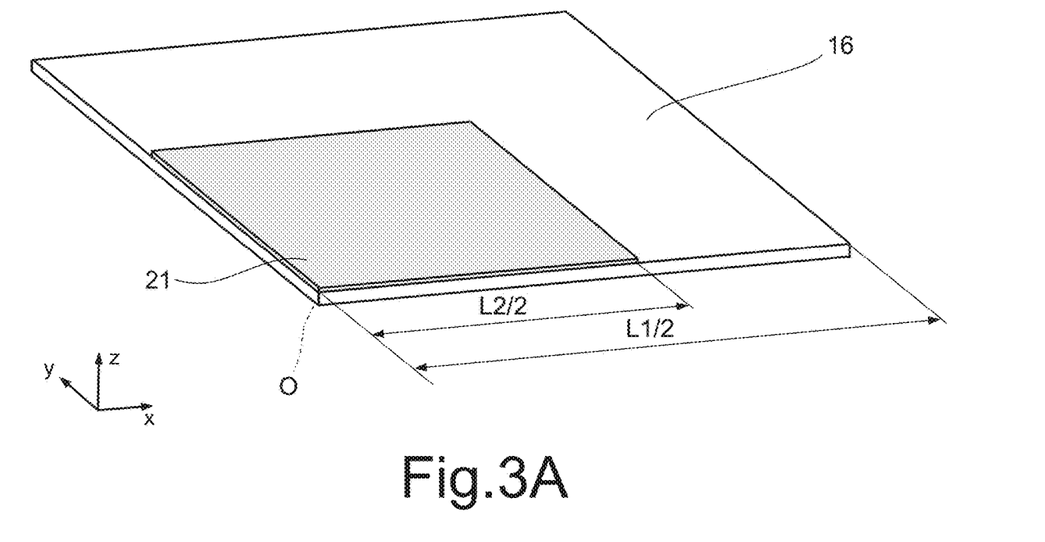
FIGS. 3A-3B show, respectively, a portion of an actuation membrane of the pressure sensor of FIG. 1, and the same portion of actuation membrane subjected to deformations by the piezoelectric effect.

In this regard, FIG. 3A shows a model of a portion of the self-test structure 12, which represents in particular one quarter of the actuation membrane 16 and of the overlying piezoelectric region 21 (in FIG. 3A, the lower and upper electrodes 22a, 22b are not illustrated for reasons of clarity). The geometrical center of the actuation membrane 16 is designated by O and in this case also corresponds to the geometrical center of the piezoelectric region 21.

In particular, denoted by L1 is the length of the side of the actuation membrane 16, in the representation in FIG. 3A along the first horizontal axis x of the horizontal plane xy, whereas denoted by L2 (<L1) is the length of the corresponding side of the piezoelectric region 21 (it should thus be noted that illustrated in FIG. 3A is half of the lengths L1 and L2; it should further be noted that, on the hypothesis where the actuation membrane 16 and the piezoelectric region 21 have a square conformation, these lengths L1 and L2 also correspond to the extension along the second horizontal axis y).

Figure 3B:
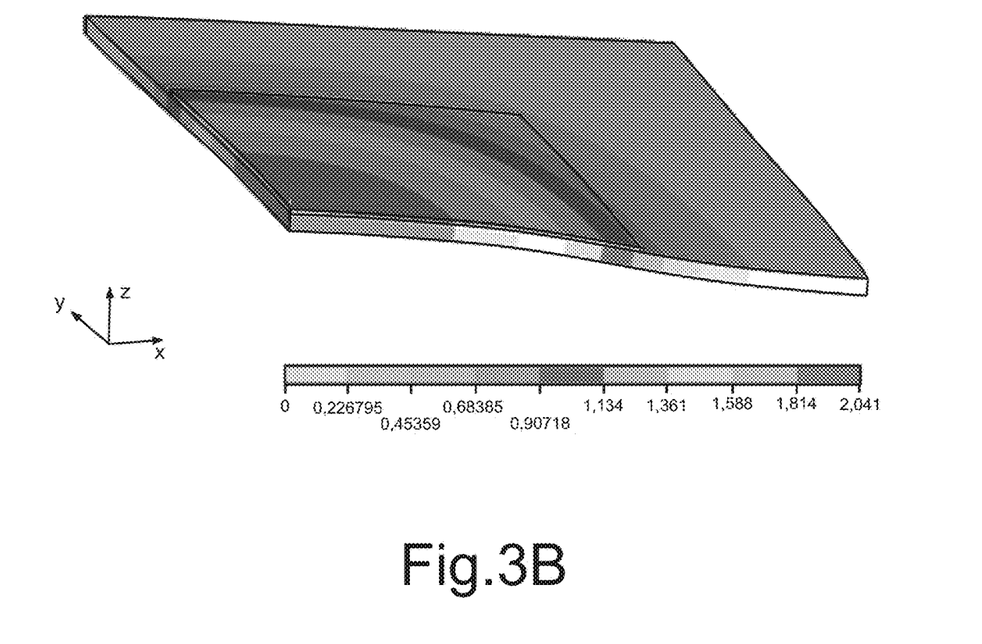

FIG. 3B shows the resulting deformation of the actuation membrane 16, due to application of the electric potential $\Delta V$ between the lower and upper electrodes 22a, 22b of the actuation assembly 20, which causes a deflection of the piezoelectric region 21 and consequently of the actuation membrane 16 along the vertical axis z; this deformation is of a greater amplitude at the center O and decreases progressively with the distance from the center O.

Figure 4:
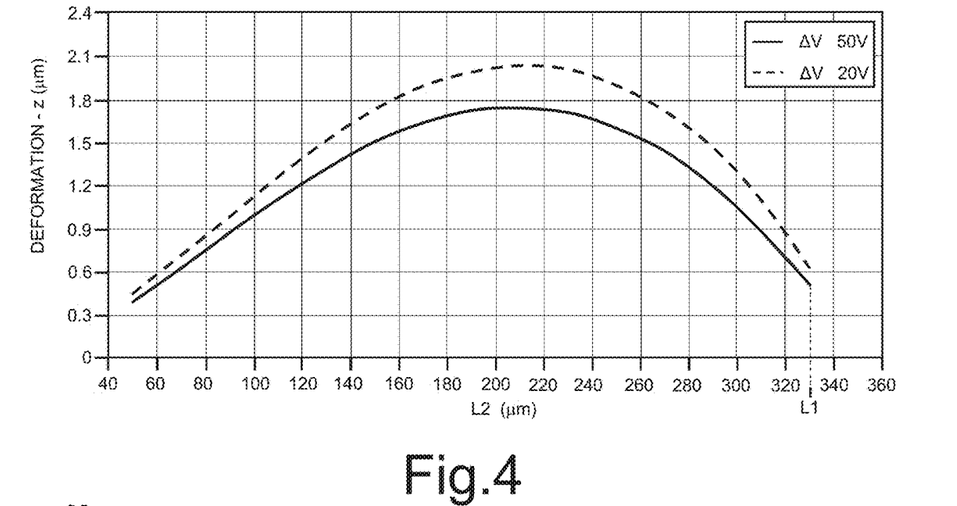
FIG. 4 shows plots regarding deformation of the portion of the actuation membrane of the pressure sensor of FIGS. 3A-3B.

FIG. 4 shows plots of the maximum value of deflection along the vertical axis z as a function of the length L2 of the piezoelectric region 21, which is assumed as being variable for the purposes of optimization of its dimensions, given a fixed length L1 for the actuation membrane 16; in particular, two plots are illustrated, for two values of the electric potential $\Delta V$ applied between the lower and upper electrodes 22a, 22b of the actuation assembly 20.

As may be evinced from an examination of the plots of FIG. 4, the value of the length L2 of the piezoelectric region 21, with respect to the length L1 of the actuation membrane 16 (which is also illustrated in FIG. 4), determines the maximum amount of the resulting deflection; in particular, it may be noted that an optimized pattern for the aforesaid deflection is obtained for values of length L2 that satisfy the following relation:

$$0.4 \cdot L1 < L2 < 0.8 \cdot L1$$

i.e., for the following ratio between the lengths L2 and L1:

$$0.4 < L2/L1 < 0.8$$

For instance, the value of the length L2 of the piezoelectric region 21 may advantageously be 0.6 times the value of the length L1 of the actuation membrane 16.

A description of a manufacturing process for manufacturing the pressure sensor 1 is now presented, according to an embodiment of the present solution.

Figure 5A:
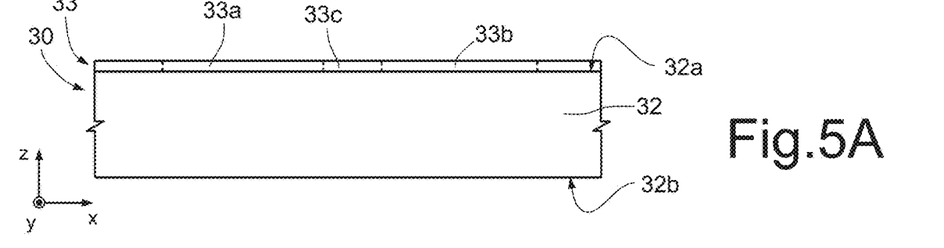
FIG. 5A is a schematic cross-sectional view of a wafer of semiconductor material in an initial step of the manufacturing process of the pressure sensor of FIG. 1.

In an initial step of the manufacturing process, as illustrated in FIG. 5A, a wafer 30 of semiconductor material is provided made, for example, of monocrystalline silicon, which includes a substrate 32, for example, with a doping of an n type (or equivalently of a p type), having a front surface 32a and a rear surface 32b.

The manufacturing process proceeds with formation of buried cavities, completely contained within the wafer 30, overlaid by a respective membrane, with techniques described in detail, for example, in EP 1 324 382 B1 filed in the name of the present Applicant, in particular for formation of the buried cavities 5, 15 of the sensing structure 4 and self-test structure 12, and of the sensing membrane 6 and actuation membrane 16, respectively.

Figure 5B:
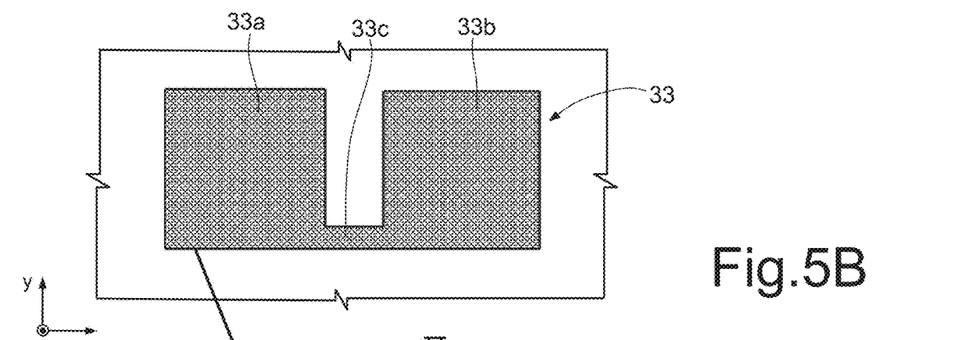
FIG. 5B is a schematic top plan view of the wafer of FIG. 5A.

As illustrated also in FIG. 5B (which, like the remaining figures, is not in scale), an etching mask 33 is provided on the front surface 32a of the substrate 32, made, for example, of a photosensitive material, the so-called "photoresist".

The etching mask 33 includes, for obtaining each pressure sensor 1: a first mask element 33a, which in the example has an approximately square shape, defines a first etching area that corresponds to the area that will be occupied by the buried cavity 5 of the sensing structure 4, and has an extension corresponding to the extension of the sensing membrane 6 that will be formed above the buried cavity 5; a second mask element 33b, which, in the example, also has an approximately square shape, defines a second etching area that corresponds to the area that will be occupied by the buried cavity 15 of the self-test structure 12, and has an extension corresponding to the extension of the actuation membrane 16 that will be formed above the buried cavity 15; and furthermore a third mask element 33c, which defines a third etching area corresponding to the area that will be occupied by the connection channel 18 of the self-test structure 12.

Figure 5C:
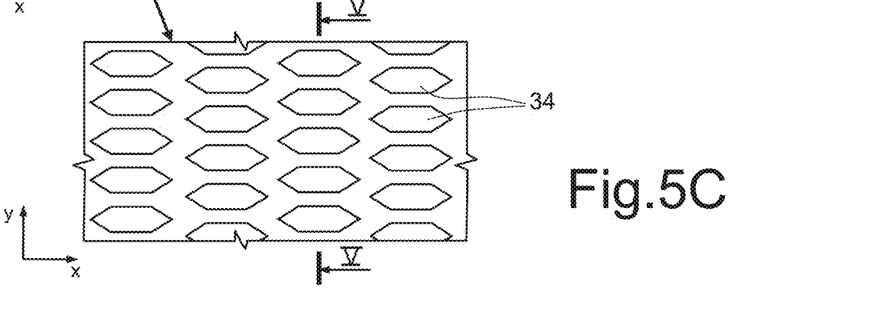
FIG. 5C shows an enlarged detail of a portion of a photolithographic mask used in the manufacturing process.

As illustrated in the enlarged detail of FIG. 5C, each mask element 33a, 33b, 33c includes a plurality of mask portions

34, for example, hexagonal portions, which define a lattice, for example, a honeycomb lattice.

Then (see FIG. 5D, which, like FIG. 5C, represents only an enlarged portion of the wafer 30, for reasons of clarity of illustration), using the etching mask 33 an anisotropic chemical etch of the substrate 32 is performed, following upon which trenches 36 are formed that communicate with one another and delimit a plurality of columns 37.

Figure 5D:
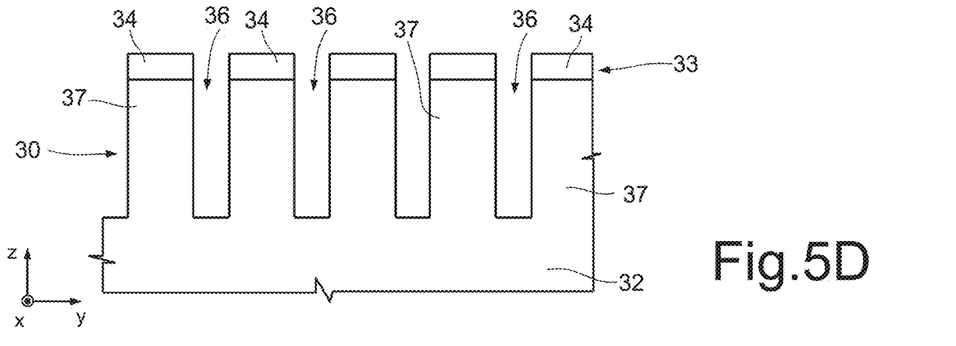
FIGS. 5D-5H are schematic cross-sectional views of the wafer of semiconductor material in successive steps of the manufacturing process.

In practice, the trenches 36 form an open region having a complex shape (corresponding to the lattice of the etching mask 33), extending in which are the columns 37 (which have a shape corresponding to the mask portions 34).

Figure 5E:
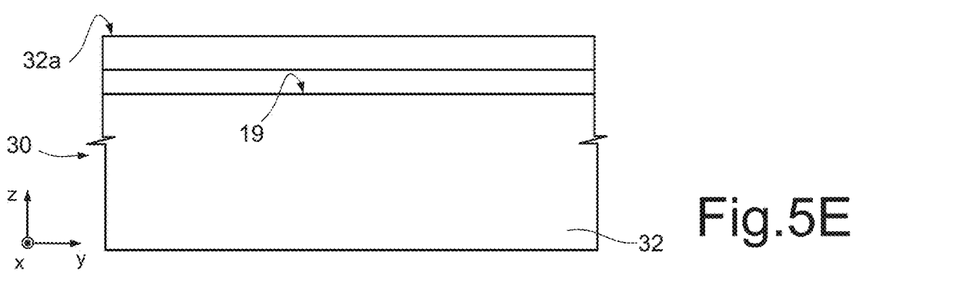

Next, the etching mask 33 is removed, and an epitaxial growth is carried out in a deoxidizing environment (typically, in atmosphere with a high hydrogen concentration, preferably with trichlorosilane—SiHCl$_3$). Consequently, an epitaxial layer grows on the columns 37 and closes the aforesaid open region formed by the trenches 36 at the top. This is followed by a step of thermal annealing, for example, for 30 min at 1190° C., preferably in a reducing atmosphere, typically a hydrogen atmosphere. The annealing step causes migration of the silicon atoms, which tend to move into a position of lower energy. Consequently, and also thanks to the short distance between the columns 37, the silicon atoms migrate completely from the portions of the columns 37 present within the aforesaid open region formed by the trenches 36, and, starting from said region, a buried region is formed, as illustrated in FIG. 5E (which shows a portion of the wafer 30 corresponding to what appears in FIG. 5D).

Figure 5F:
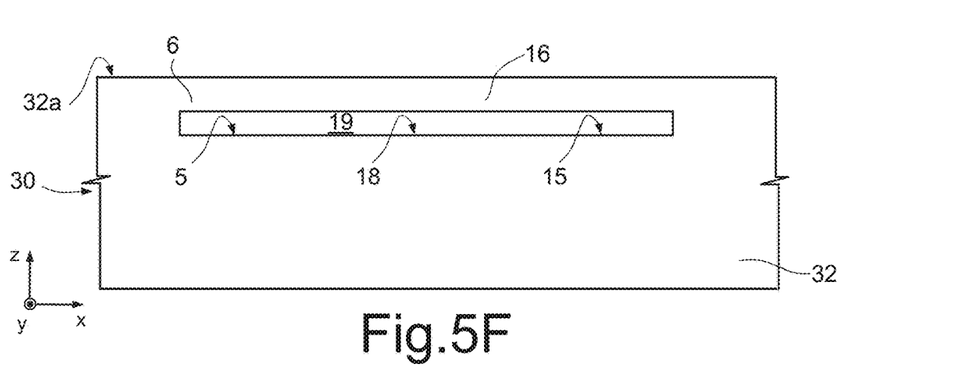

In particular, as illustrated also in FIG. 5F (which shows a wider portion of the wafer 30), this buried region defines the buried space 19 including the buried cavities 5, 15 of the sensing structure 4 and of the self-test structure 12 and the connection channel 18, which puts in fluid communication the same buried cavities 5, 15 (and is provided at the same depth with respect to the front surface 32*a* of the substrate 32). Advantageously, as a result of the process steps described, the environment with controlled atmosphere is created within the aforesaid buried space 19, containing residual gas (in the example, hydrogen and silane) at a desired pressure, as mentioned previously, for example, comprised between 0.1 and 100 mbar, for instance, approximately 20 mbar.

A thin silicon layer remains above the buried region, constituted in part by silicon atoms grown epitaxially and in part by migrated silicon atoms, which forms a membrane region, which is flexible and may bend in the presence of external stresses.

In particular, this membrane region defines the sensing membrane 6 of the sensing structure 4, and also the actuation membrane 16 of the self-test structure 12.

Advantageously, with the same process steps, the connection channel 18, the buried cavities 5, 15, as well as the respective sensing and actuation membranes 6, 16, are then formed.

Figure 5G:
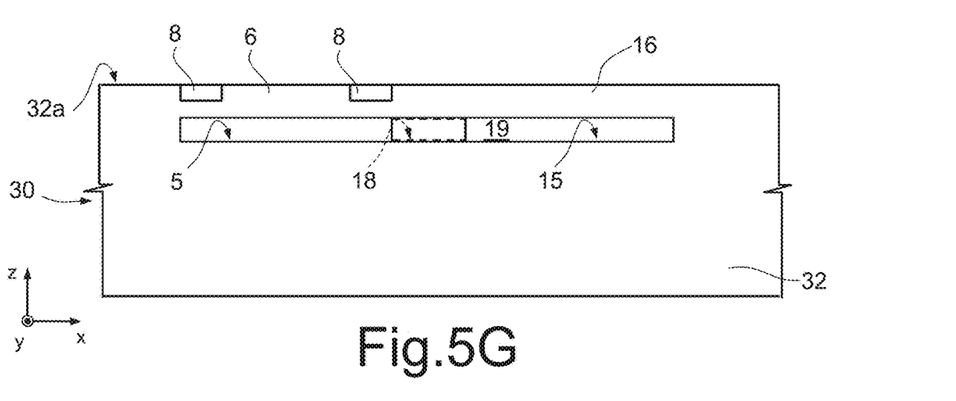

As illustrated in FIG. 5G, the manufacturing process proceeds with formation, via diffusion or implantation of dopant atoms, of the sensing elements 8, of a piezoresistive type, within the sensing membrane 6 of the sensing structure 4.

Figure 5H:
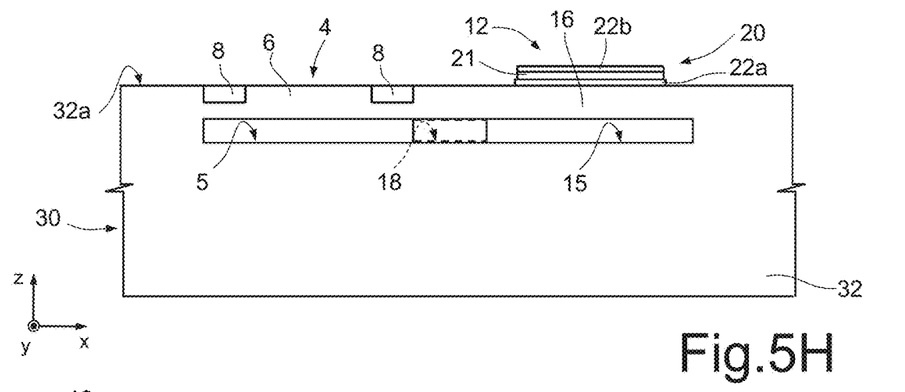

Then, on the front surface 32*a* of the substrate 32 (FIG. 5H) the following elements are then formed, for example by deposition, and appropriately shaped, for example by photolithographic etching: a first conductive layer, made, for example, of a metal material, for formation of the lower electrode 22*a* of the self-test structure 12 and also (in a way not illustrated in FIG. 5H), of the electrical-connection elements 9, of the electrical-connection elements 23 that contact the lower electrode 22*a*, and of the corresponding electrical contact pads 10, 24; a layer of piezoelectrical material, for example, PZT, for formation of the piezoelectric region 21 of the self-test structure 12, on the lower electrode 22*a* on the actuation membrane 16; and a second conductive layer, made, for example, of a respective metal material, for formation of the upper electrode 22*b* of the self-test structure 12 and also (in a way not illustrated herein) of the electrical-connection elements 23 that contact the upper electrode 22*b* and the corresponding electrical contact pads 24.

In a way not illustrated in detail, but that will be evident to a person skilled in the art, the manufacturing process may further envisage formation and shaping of appropriate separation layers or buffers, of dielectric material, having the function of insulation or protection.

The manufacturing process then ends with a step of sawing or dicing of the wafer 30, to obtain a plurality of dies, each integrating a respective pressure sensor 1 constituted by a respective monolithic body 2, which is thus formed by a portion of the substrate 32 originating from dicing of the wafer 30, in which the sensing structure 4 and the self-test structure 12 are integrated (as illustrated in the previous FIG. 1).

The advantages of the present solution emerge clearly from the foregoing description.

In any case, it is again underlined that the solution described allows, in a simple and effective way, to provide with self-test capability a pressure sensor 1 having a sensing structure 4 of a piezoresistive type so as to enable testing of proper operation thereof both at the end of the manufacturing process and during normal operation of the pressure sensor 1. This characteristic is particularly advantageous, as pointed out previously, for example, for applications in the automotive field.

In particular, the self-test structure 12, which is additional to the sensing structure 4 of the pressure sensor 1, does not entail a substantial increase in cost and manufacturing complexity in so far as it envisages, for its manufacturing, process steps that are in common with those already envisaged for the manufacturing of the sensing structure 4 of the pressure sensor 1.

Figure 6:
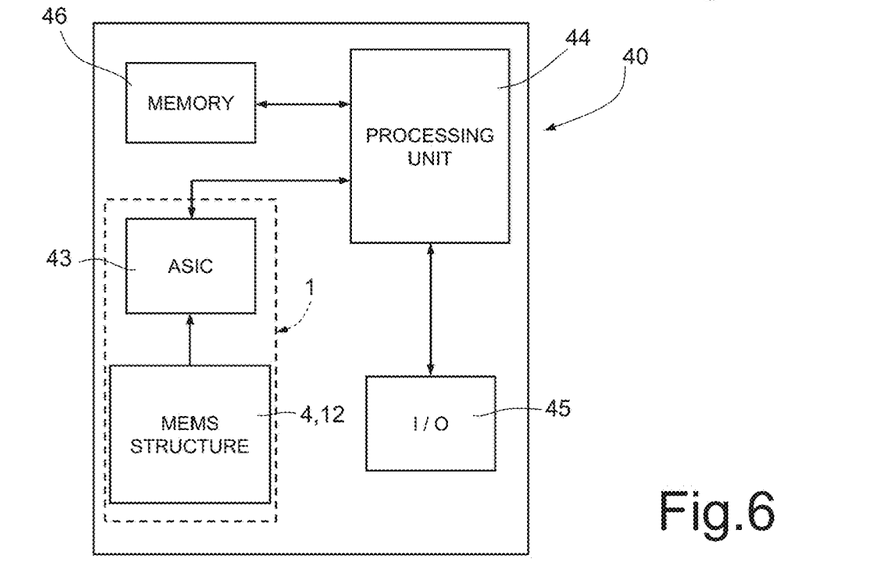
FIG. 6 is a general block diagram of an electronic device in which the pressure sensor of FIG. 1 is integrated according to one embodiment of the present disclosure.

In general, the aforesaid characteristics make the use of the pressure sensor 1 particularly advantageous in an electronic device 40, for example, for barometric applications in the automotive field, as illustrated schematically in FIG. 6.

In particular, in FIG. 6, the pressure sensor that integrates a MEMS structure including the sensing structure 4 and the self-test structure 12 described previously is designated once again by 1. The pressure sensor 1 further includes an ASIC 43, which provides the corresponding reading interface (and which may be provided in the same die or in a different die, which may in any case be housed in the same package).

The electronic device 40 is generally able to process, store and/or transmit and receive signals and information, and includes: a processing unit 44, which receives the signals detected by the pressure sensor 1 and is further configured to control application of the actuation stimulus between the lower and upper electrodes 22*a*, 22*b* of the actuation assembly 20 of the self-test structure 12 so as to enable testing of operation of the sensing structure 4 of the same pressure sensor 1; an input/output interface 45 connected to the processing unit, which may be a microprocessor, 44; and an internal memory 46, of a non-volatile type.

The electronic device 40, used in the automotive field, may, for example, have control functions for the air/fuel mixture combustion in the engine, or else control functions for opening of an airbag based on the pressure value detected, or else control functions for the braking system.

Finally, it is clear that modifications and variations may be made to what has been described and illustrated herein, without thereby departing from the scope of the present disclosure, as defined in the appended claims.

In particular, different conformations and/or arrangements of the piezoelectric region 21 of the self-test structure 12 may be envisaged.

Figure 7:
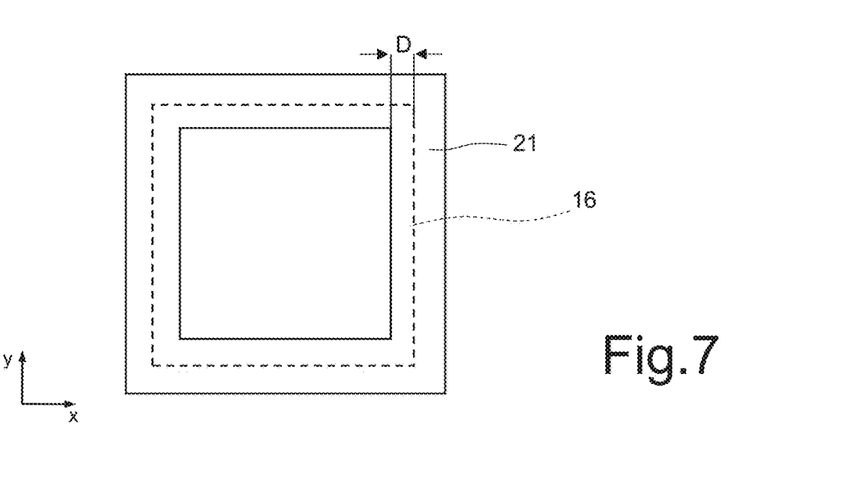
FIG. 7 is a schematic top plan view of a portion of the pressure sensor according to a possible embodiment of the present disclosure.

For instance, as illustrated schematically in FIG. 7, the piezoelectric region 21 may be shaped like a frame, for example, substantially like a square ring, and be arranged at the perimetral sides of the underlying actuation membrane 16 (which, in this case, has an extension in the horizontal plane xy smaller than that of the aforesaid frame). The frame defines internally an empty region, without piezoelectric material; the size, along the first or second horizontal axes x, y, designated by D in FIG. 7, between an internal edge of the aforesaid frame and the perimeter of the actuation membrane 16 may, for example, be between 10 μm and 50 μm.

Modifications could be envisaged to the materials used for manufacturing of the pressure sensor 1; for example, different metal or dielectric materials and/or a different piezoelectrical material could be used.

Furthermore, it is evident that the pressure sensor 1 may advantageously be used also for different applications in which it is desired to obtain pressure sensing with self-test characteristics, for example, in portable or wearable devices (such as smartphones, tablets, smartwatches, or the like), or in industrial applications.

The pressure sensor 1 may possibly be integrated with further inertial MEMS sensors and/or microphone sensors, thanks to the general compatibility of the manufacturing process used.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical pressure sensor, comprising:
 a monolithic body of semiconductor material having a front surface;
 a sensing structure integrated in said monolithic body and including:
  a first buried cavity completely contained within the monolithic body at said front surface;
  a sensing membrane suspended above the first buried cavity in a surface portion of the monolithic body; and
  sensing elements of a piezoresistive type arranged in the sensing membrane and configured to detect a deformation of said sensing membrane in response to a pressure;
 a self-test structure integrated within the monolithic body and configured to cause a testing deformation of said sensing membrane, the self-test structure including:
  a second buried cavity completely contained within the monolithic body at said front surface;
  an actuation membrane suspended above the second buried cavity; and
  an actuation assembly coupled to the actuation membrane and configured to cause a deformation of the actuation membrane; and
 a connection channel buried and contained within the monolithic body fluidically connecting the first and second buried cavities, the connection channel configured to enable the testing deformation of said sensing membrane in response to the deformation of said actuation membrane.

2. The microelectromechanical pressure sensor according to claim 1, wherein a buried space includes said connection channel and the first and second buried cavities, the buried space being entirely contained and isolated within the monolithic body and the buried space containing an atmosphere at a controlled pressure.

3. The microelectromechanical pressure sensor according to claim 2, wherein said controlled pressure is comprised between 0.1 mbar and 100 mbar.

4. The microelectromechanical pressure sensor according to claim 2, wherein said connection channel is arranged at a same depth with respect to the front surface of the monolithic body as the first and second buried cavities.

5. The microelectromechanical pressure sensor according to claim 1, wherein said actuation assembly comprises a piezoelectric region arranged on said actuation membrane.

6. The microelectromechanical pressure sensor according to claim 5, wherein said piezoelectric region comprises lead titanate zirconate (PZT).

7. The microelectromechanical pressure sensor according to claim 5, wherein said actuation membrane has a main extension in a horizontal plane and said piezoelectric region is arranged in the horizontal plane centrally with respect to the actuation membrane; and wherein a ratio between a length of said piezoelectric region in said horizontal plane and a corresponding length of said actuation membrane in said horizontal plane is between 0.4 and 0.8.

8. The microelectromechanical pressure sensor according to claim 5, wherein said actuation assembly further comprises:
 a lower electrode arranged over the actuation membrane on the front surface of the monolithic body; and
 an upper electrode arranged on the piezoelectric region, with the piezoelectric region being arranged on the lower electrode.

9. The microelectromechanical pressure sensor according to claim 1, wherein said sensing elements comprise doped surface regions within the sensing membrane.

10. An electronic device, comprising:
 a pressure sensor including:
  a body of semiconductor material having a front surface;
  a sensing structure in the body, the sensing structure including:
   a first buried cavity in the body;
   a sensing membrane suspended above the first buried cavity in a surface portion of the body extending from the front surface; and
   piezoresistive sensing elements in the sensing membrane that in operation detect deformation of the sensing membrane in response to a pressure and generate electrical signals based on the detected deformation; and
  a self-test structure in the body and coupled to the sensing membrane through the first buried cavity, the self-test structure, in operation, deforms the sensing membrane in response to an actuation stimulus to test operation of the sensing structure, the self-test including:
  a second buried cavity in the body and fluidly coupled to the first buried cavity;
  actuation membrane suspended above the second buried cavity; and
  an actuation assembly on the front surface and over the actuation membrane; and
a processing unit coupled to the pressure sensor to receive the electrical signals, the processing unit, in operation, applies the actuation stimulus to the self-test structure.

11. The electronic device of claim 10, wherein
the actuation membrane has an outer perimeter,
the actuation assembly includes a frame-shaped piezoelectric region having a width extending between an internal edge and an outer edge, and
the width of the frame-shaped piezoelectric region extends over the outer perimeter of the actuation membrane.

12. A process for manufacturing a microelectromechanical pressure sensor, comprising:
  forming a first buried cavity completely contained within a substrate having a front surface;
  forming a sensing membrane suspended over the first buried cavity;
  forming sensing elements of a piezoresistive type in the sensing membrane, the sensing elements configured to detect a deformation of said sensing membrane as a result of a pressure;
  forming a self-test structure integrated within the substrate to enable application of a testing deformation of said sensing membrane, forming of the self-test structure including:
    forming a second buried cavity completely contained within the substrate at the front surface;
    forming an actuation membrane suspended above the second buried cavity; and
    forming an actuation assembly coupled to the actuation membrane and configured to cause deformation of the actuation membrane; and
  fluidically connecting the first and second buried cavities within the substrate to enable the testing deformation of said sensing membrane in response to deformation of said actuation membrane.

13. The process of claim 12, wherein fluidically connecting the first and second buried cavities comprises forming a buried connection channel within the substrate.

14. The process according to claim 13, wherein
fluidically connecting of the first and second buried cavities includes forming a connection channel buried and contained within the monolithic body, and forming the first buried cavity, forming the second buried cavity of said self-test structure, and forming said connection channel are carried out concurrently.

15. The process according to claim 14, wherein forming the first buried cavity, forming the second buried cavity of said self-test structure, and forming said connection channel comprise jointly forming a buried space entirely contained and isolated within the substrate and containing an atmosphere at a controlled pressure.

16. The process according to claim 15, wherein forming the first buried cavity, forming the second buried cavity of said self-test structure, and forming said connection channel comprise:
  forming trenches in respective areas within said substrate starting from the front surface, the trenches delimiting columns of semiconductor material;
  epitaxially growing, starting from said columns, a closing layer of semiconductor material, said closing layer closing said trenches at a top of the trenches at the front surface; and
  carrying out a thermal treatment to cause migration of the semiconductor material of said columns towards said closing layer to form the first buried cavity and the second buried cavity of said self-test structure, and, at a same time, to form said sensing and actuation membranes suspended above said first and second buried cavities, respectively, and said connection channel between said first and second buried cavities.

17. The process according to claim 12, wherein forming said actuation assembly comprises forming a piezoelectric region arranged on said actuation membrane.

18. The process according to claim 15, wherein forming said piezoelectric region comprises forming a layer of lead titanate zirconate (PZT).

19. The process according to claim 17, wherein forming the piezoelectric region comprises forming said piezoelectric region centrally with respect to the actuation membrane, wherein said actuation membrane has a main extension in a horizontal plane, and a ratio between a length of said piezoelectric region in a direction of said horizontal plane and a corresponding length of said actuation membrane is comprised between 0.4 and 0.8.

20. The process according to claim 17, wherein forming said actuation assembly further comprises:
  forming a lower electrode arranged over the actuation membrane on the front surface of the substrate; and
  forming an upper electrode arranged on the piezoelectric region with the piezoelectric region being arranged on the lower electrode.

21. The electronic device of claim 10, wherein the pressure sensor includes a connection channel buried in the body, the connection channel fluidically connecting the first and second buried cavities to each other.

* * * * *

UNITED STATES PATENT AND TRADEMARK OFFICE
CERTIFICATE OF CORRECTION

| | |
|---|---|
| PATENT NO. | : 11,054,327 B2 |
| APPLICATION NO. | : 16/248415 |
| DATED | : July 6, 2021 |
| INVENTOR(S) | : Enri Duqi et al. |

It is certified that error appears in the above-identified patent and that said Letters Patent is hereby corrected as shown below:

In the Claims

Column 11, Claim 10, Line 3:
"including:" should read: -- structure including: --.

Column 11, Claim 10, Line 6:
"actuation membrane" should read: -- an actuation membrane --.

Signed and Sealed this
Tenth Day of May, 2022

Katherine Kelly Vidal
*Director of the United States Patent and Trademark Office*